(12) United States Patent
Takahashi

(10) Patent No.: US 8,723,517 B2
(45) Date of Patent: May 13, 2014

(54) REDUCTION OF SLICE SELECT ARTIFACTS IN HALF PULSE EXCITATIONS USED IN ULTRASHORT TE (UTE) IMAGING

(75) Inventor: Atsushi Mark Takahashi, Menlo Park, CA (US)

(73) Assignee: General Electric Company, Schenectady, NY (US)

(*) Notice: Subject to any disclaimer, the term of this patent is extended or adjusted under 35 U.S.C. 154(b) by 580 days.

(21) Appl. No.: 12/842,520

(22) Filed: Jul. 23, 2010

(65) Prior Publication Data

US 2012/0019243 A1    Jan. 26, 2012

(51) Int. Cl.
*G01R 33/48* (2006.01)
*G01R 33/483* (2006.01)
*G01R 33/46* (2006.01)

(52) U.S. Cl.
CPC ........ *G01R 33/4816* (2013.01); *G01R 33/4833* (2013.01); *G01R 33/4633* (2013.01); *G01R 33/4641* (2013.01)
USPC .............................. 324/307; 324/309; 324/318

(58) Field of Classification Search
CPC ........... G01R 33/4633; G01R 33/4641; G01R 33/4816; G01R 33/4836; G01R 33/48; G01R 33/46
USPC .......................... 324/300–322; 600/407–435; 382/128–131
See application file for complete search history.

(56) References Cited

U.S. PATENT DOCUMENTS

| | | | |
|---|---|---|---|
| 5,025,216 A | 6/1991 | Pauly et al. | |
| 7,288,936 B2* | 10/2007 | Larson et al. | 324/307 |
| 7,474,097 B2* | 1/2009 | Bydder et al. | 324/307 |
| 7,602,184 B2* | 10/2009 | Du | 324/309 |
| 7,750,632 B2* | 7/2010 | Qian et al. | 324/307 |
| 8,022,704 B2* | 9/2011 | Qian et al. | 324/309 |
| 8,148,979 B1* | 4/2012 | Du | 324/307 |
| 2007/0080685 A1* | 4/2007 | Bydder et al. | 324/309 |
| 2007/0255129 A1* | 11/2007 | Du et al. | 600/410 |
| 2008/0258727 A1* | 10/2008 | Qian et al. | 324/312 |
| 2009/0009167 A1* | 1/2009 | Du | 324/307 |
| 2010/0231218 A1* | 9/2010 | Qian et al. | 324/309 |
| 2011/0006765 A1* | 1/2011 | Zhao | 324/307 |
| 2011/0245655 A1* | 10/2011 | Abe et al. | 600/410 |
| 2012/0019243 A1* | 1/2012 | Takahashi | 324/309 |

OTHER PUBLICATIONS

Onodera et al., A Method of Measuring Field-Gradient Modulation Shapes. Application to High-Speed NMR Spectroscopic Imaging, J. Phys.E: Sci. Instrum. 20:416-419 (1987) UK.
Conolly et al., Variable-Rate Selective Excitation. Journal of Magnetic Resonance 78:440-458 (1998) Academic Press, California.
Wansapura et al., Temperature Mapping of Frozen Tissue Using Eddy Current Compensated Half Excitation RF Pulses. Magnetic Resonance in Medicine. 46:985-992 (2001) Wiley-Liss, Inc.

(Continued)

*Primary Examiner* — Melissa Koval
*Assistant Examiner* — Tiffany Fetzner
(74) *Attorney, Agent, or Firm* — Fletcher Yoder, P.C.

(57) ABSTRACT

The present embodiments are directed towards artifact reduction in slice select pulse sequences utilized in ultra short echo time imaging sequences. In one embodiment, a method includes determining a desired slice select thickness, determining a radiofrequency pulse shape and duration based upon the desired slice select thickness while maintaining a desired relationship between excitation k space and radiofrequency amplitude, and determining radiofrequency scaling based on the determined radiofrequency pulse shape and duration.

18 Claims, 8 Drawing Sheets

(56) References Cited

OTHER PUBLICATIONS

Josan, S., et al.; "Double Half RF Pulse for Reduced Sensitivity to Linear Eddy Currents in Ultrashort T2 Imaging"; Electrical Engineering, Stanford University, Stanford, CA, United States, Radiology, Stanford University, Stanford, CA, United States; Proc. Intl. Soc. Mag. Reson. Med. 14 (2006), p. 3004.

Josan, S., et al.; "Inverted Double Half RF Pulse for Long T2 suppression in Ultrashort Echo-Time Imaging"; Electrical Engineering, Stanford University, Stanford, CA, United States, Radiology, Stanford University, Stanford, CA, United States; Proc. Intl. Soc. Mag. Reson. Med. 15 (2007), p. 1711.

Josan, S., et al.; "Improved Half RF Slive Selectivity in Presence of Eddy Currents with Quadratic Phase Saturation"; Electrical Engineering, Stanford University, Stanford, CA, United States, Radiology, Stanford University, Stanford, CA, United States; Proc. Intl. Soc. Mag. Reson. Med. 16 (2008), p. 1320.

* cited by examiner

REDUCTION OF SLICE SELECT ARTIFACTS IN HALF PULSE EXCITATIONS USED IN ULTRASHORT TE (UTE) IMAGING

BACKGROUND OF THE INVENTION

The subject matter disclosed herein relates to magnetic resonance pulse sequences, and more specifically, to techniques for ultra short TE (UTE) imaging.

In general, magnetic resonance imaging (MRI) examinations are based on the interactions among a primary magnetic field, a radiofrequency (RF) excitation field, and time varying magnetic gradient fields with gyromagnetic material having nuclear spins within the subject of interest. Certain gyromagnetic materials, such as hydrogen nuclei in water molecules, have characteristic behaviors in response to external magnetic fields. The precession of spins of these nuclei can be influenced by manipulation of the fields to produce RF signals that can be detected, processed, and used to reconstruct a useful image.

The magnetic fields used to generate images in MRI systems include a highly uniform, static magnetic field that is produced by a primary magnet. A series of gradient fields are produced by a set of gradient coils located around the subject. The gradient fields encode positions of individual plane or volume elements (pixels or voxels) in two or three dimensions. An RF coil is employed to produce an RF excitation field. This RF field perturbs the spins of some of the gyromagnetic nuclei from their equilibrium directions, causing the spins to precess around the axis of their equilibrium magnetization. During this precession and during relaxation, RF signals are emitted by the spinning, precessing nuclei and are detected by either the same transmitting RF coil, or by a separate coil. These signals are amplified, filtered, and digitized. The digitized signals are then processed using one or more algorithms to reconstruct a useful image.

One advantage of MRI is that a user (e.g., a radiologist) has the ability to image certain slices of a patient, such as sections of the abdomen, chest, head, vertebrae, and so forth from any desired angle. To obtain these slices, a gradient is superimposed on the static magnetic field, which may be considered a slice selection gradient (GSS). A desired slice may be obtained from within a plane transverse to the applied gradient by exciting the gyromagnetic nuclei within the plane. When the GSS is present, the nuclei may be selectively excited using an RF excitation pulse. To selectively excite the nuclei, the RF excitation pulse may have a frequency spectrum encompassing their Larmor frequency, or the frequency of their precessing nuclear spins.

In the medical imaging context, the nuclei selected for excitation within a desired slice may be contained within different tissues, and each tissue may have a characteristic spin relaxation parameter. For example, certain tissues within the selected slice may have differing T1 and T2 relaxation constants, which contribute to the contrast of the resultant image. In some configurations, the contrast of the image may be manipulated by the user by weighting the image in a relaxation parameter, for example either T1 or T2, which can provide valuable information for clinical diagnoses. Such manipulation may be performed by specially-designed pulse sequences that are configured to suppress or isolate a given relaxation parameter. However, the successful implementation of the pulse sequences that allow the selection of a desired slice and the generation of a weighted image may be highly sensitive to the relaxation time of the tissue (which can be on the order of the pulse sequence time) and the ability of the imaging equipment to rapidly and accurately produce the desired pulses.

While pulse sequences may be manipulated to perform various functions, the imaging equipment which produces the sequences may be limited, such as in its ability to ramp up and ramp down (slew) a pulse amplitude in a given amount of time. Such constraints generally result in the gradient and RF pulses taking on a trapezoidal shape when graphed versus time, with a ramp up period, generally constant period, and a ramp down period. These equipment-related constraints are typically unavoidable, and current techniques to image certain tissues, such as tissues having small spin-spin relaxation times (relatively short T2) are often inadequate and/or suffer from undesirable out-of-slice signal contamination (image artifacts).

BRIEF DESCRIPTION OF THE INVENTION

In one embodiment, a method for performing a magnetic resonance imaging sequence is provided. In a 2-dimensional ultra short echo time pulse sequence, the method includes determining a desired slice select thickness, determining a radiofrequency pulse shape and duration based upon the desired slice select thickness while maintaining a desired relationship between excitation k space and radiofrequency amplitude, and determining radiofrequency scaling based on the determined radiofrequency pulse shape and duration.

In another embodiment, a method for performing a magnetic resonance imaging sequence is provided. In a 2-dimensional ultra short echo time pulse sequence, the method includes determining a desired slice select thickness, applying a slice select gradient waveform for the desired slice select thickness, determining a parameter of the slice select gradient waveform for the desired slice select thickness, and determining a radiofrequency pulse shape and duration based upon the determined parameter while maintaining a desired relationship between excitation k space and radiofrequency amplitude.

In a further embodiment, a magnetic resonance imaging system is provided. The system includes a primary field magnet, a set of gradient field coils, a radiofrequency field coil, and control circuitry coupled to the gradient field coils and to the radiofrequency field coil. The control circuitry is configured to apply control signals to the gradient and radiofrequency coils to perform a 2-dimensional ultra short echo time pulse sequence. The sequence includes applying a gradient waveform and a radiofrequency pulse to select a set of gyromagnetic material within a slice of a subject of interest, applying a pulse to acquire magnetic resonance data from the set of gyromagnetic material, and processing circuitry coupled to the control circuitry and configured to determine a parameter of the gradient waveform for a desired thickness of the slice of the subject of interest, and the processing circuitry determines a shape and a duration of the radiofrequency pulse based upon the determined parameter, the desired thickness of the slice, or both.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein.

DETAILED DESCRIPTION OF THE INVENTION

Figure 1:
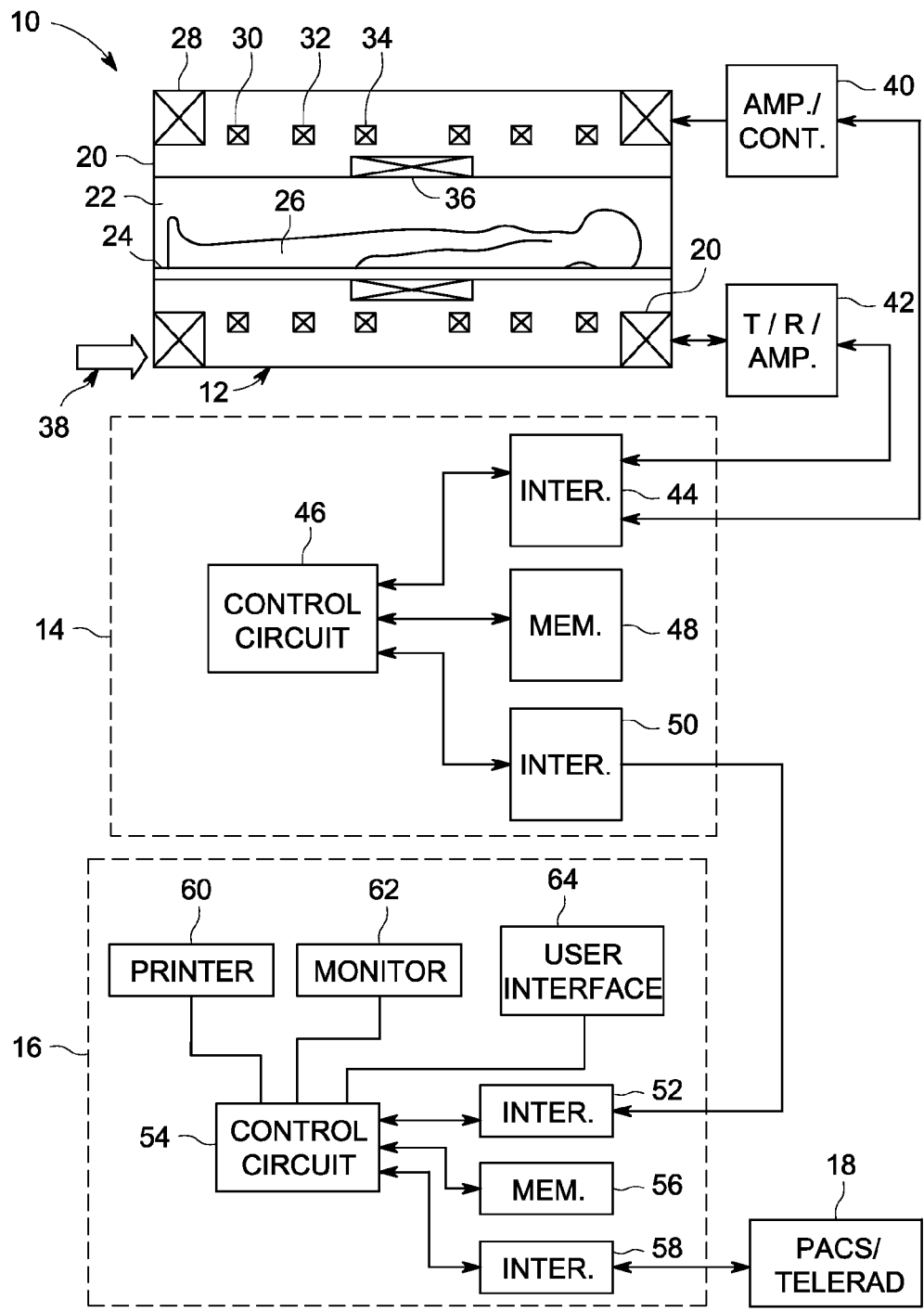
FIG. 1 is a schematic illustration of an embodiment of a magnetic resonance imaging system configured to perform UTE imaging sequences for the generation of T2 weighted images, in accordance with an aspect of the present disclosure.

As noted above, some tissues of interest may include those having relatively short spin-spin relaxation times (T2), which may include tissues such as bone, tendons, ligaments, and the like that have similar elongated orientations. It can therefore be appreciated that in-plane resolution of such tissues may provide important clinical information, such as tears, breaks, ruptures, and so on. Therefore, image artifacts may have a pronounced effect on the ability to properly diagnose a medical condition pertaining to these tissues. Further, short T2 tissues such as these often appear as dark areas in a typical MR image due to their loss of transverse magnetization prior to signal acquisition, making it difficult to perform structural diagnostics. This loss of the magnetization may occur between the maximum application of the excitation RF pulse and the echo time (TE), which is when data acquisition is typically performed (e.g., after a refocusing lobe). To avoid the loss of the T2 tissue signal, an RF excitation pulse of reduced duration is used that traverses approximately half of excitation k-space. Such pulses may be referred to as "half pulses," with signal acquisition occurring substantially immediately after the RF half pulse. Accordingly, RF half pulse sequences may result in an imaging sequence with an ultra short TE.

One significant problem with such ultra short TE imaging is that the half-pulse sequence generates signals that are spuriously generated from tissue or material outside the desired slice. This corrupts the measured signal and precludes the possibility of quantifying the relaxation time of the imaged tissues. Thus, in prior art implementations, 2D ultra short imaging is not practical in vivo in a clinical setting. Further, as the slice thickness is often varied during imaging procedures for diagnostics, a system will have to be re-calibrated for each thickness.

In a general sense, when using RF half pulse sequences, small changes in the slice thickness may result in large changes in the gradient waveforms. These changes may be especially pronounced on the gradient ramps and during the short period (e.g., 300 μs) following the end of a gradient trapezoid. This variation after the end of the gradient and associated RF pulse may be troublesome because the origin of excitation k-space is determined by the area of the gradients between the end of the RF and the beginning of data acquisition. Depending on the polarity of the integral of the gradient waveform, an overlap or a gap may appear in excitation k-space.

The embodiments described herein overcome such deficiencies of existing techniques by providing a method for generating a slice select RF half pulse based on a desired slice select thickness. In contrast to the widely accepted practice of varying gradient amplitude to generate a desired slice select thickness using a single slice select RF waveform for all thicknesses, the methods presented herein vary the shape and extent of the slice select RF waveform while utilizing a constant gradient amplitude. In one embodiment of the approaches described herein, the gradient amplitude is set to a suitable maximum level, which may reduce the effect of gradient non-linearity on a resulting slice profile. Further, in some embodiments, a selected gradient waveform is measured to determine a trajectory that the slice selection RF half pulse follows as it traverses excitation k-space. As the desired slice select thickness is changed, the shape and duration of the slice select RF half pulse changes as well, and the RF half pulse maintains the determined trajectory through excitation k-space. In some embodiments, the RF half pulse is generated at runtime. That is, the RF half pulse shape and duration is determined as the imaging sequence is being performed. In a UTE imaging sequence, one RF half pulse is generated, and two slice select pulse sequences are performed with alternate gradient amplitude phase. The data obtained after each pulse sequence is then added to generate data representative of a T2 weighted image.

The UTE imaging sequence described above, including the generation of the slice select RF pulse shape and duration, may be performed by a magnetic resonance imaging (MRI) system, which may be initiated by a user (e.g., a radiologist). The MRI system may perform manual or automated calibration sequences for determining the trajectory of an RF pulse through excitation k-space followed by data acquisition, data construction, and image synthesis. Such a magnetic resonance imaging system 10 is illustrated in FIG. 1. The magnetic resonance imaging system 10 is illustrated schematically as including a scanner 12, a scanner control circuit 14, and a system control circuitry 16. According to the embodiments described herein, the MRI system 10 is generally configured to perform MR imaging, such as UTE imaging sequences. System 10 additionally includes remote access and storage systems or devices as picture archiving and communication systems (PACS) 18, or other devices such as teleradiology equipment so that data acquired by the system 10 may be accessed on- or off-site. While the MRI system 10 may include any suitable scanner or detector, in the illustrated embodiment, the system 10 includes a full body scanner 12 having a housing 20 through which a bore 22 is formed. A table 24 is moveable into the bore 22 to permit a subject 26 to be positioned therein for imaging selected anatomy within the patient.

Scanner 12 includes a series of associated coils for producing a controlled magnetic field and for detecting emissions from gyromagnetic material within the anatomy of the subject being imaged. A primary magnet coil 28 is provided for generating a primary magnetic field that is generally aligned with the bore 22. A series of gradient coils 30, 32, and 34 permit controlled magnetic gradient fields to be generated during examination sequences. A radio frequency (RF) coil 36 is provided for generating radio frequency pulses for exciting the gyromagnetic material, such as for spin preparation, relaxation weighting, spin perturbation, and/or slice selection. A separate receiving coil or the same RF coil 36 may receive magnetic resonance signals from the gyromagnetic material during examination sequences.

The various coils of scanner 12 are controlled by external circuitry to generate the desired field and pulses, and to read emissions from the gyromagnetic material in a controlled manner. In the illustrated embodiment, a main power supply 38 is provided for powering the primary field coil 28. Driver circuit 40 is provided for pulsing the gradient field coils 30, 32, and 34. Such a circuit typically includes amplification and control circuitry for supplying current to the coils as defined by digitized pulse sequences output by the scanner control circuit 14. Another control circuit 42 is provided for regulating operation of the RF coil 36. Circuit 42 will typically include a switching device for alternating between the active and passive modes of operation, wherein the RF coils transmits and receives signals, respectively. Circuit 42 also includes amplification circuitry for generating the RF pulses and for processing received magnetic resonance signals.

Scanner control circuit 14 includes an interface circuit 44 which outputs signals for driving the gradient field coils and the RF coil and for receiving the data representative of the magnetic resonance signals produced in examination sequences. The interface circuit 44 is coupled to a control circuit 46. The control circuit 46 executes the commands for driving the circuit 42 and circuit 40 based on defined protocols selected via system control circuit 16. Control circuit 46 also serves to receive the magnetic resonance signals and performs subsequent processing before transmitting the data to system control circuit 16. Scanner control circuit 14 also includes one or more memory circuits 48 which store configuration parameters, pulse sequence descriptions, examination results, and so forth, during operation. Interface circuit 50 is coupled to the control circuit 46 for exchanging data between scanner control circuit 14 and system control circuit 16. Such data will typically include selection of specific examination sequences to be performed, configuration parameters of these sequences, and acquired data (e.g., T2 weighted data) which may be transmitted in raw or processed form from scanner control circuit 14 for subsequent processing, storage, transmission and display.

System control circuit 16 includes an interface circuit 52 which receives data from the scanner control circuit 14 and transmits data and commands back to the scanner control circuit 14. The interface circuit 52 is coupled to a control circuit 54 which may include a CPU in a multi-purpose or application specific computer or workstation. Control circuit 54 is coupled to a memory circuit 56 to store programming code for operation of the MRI system 10 and to store the processed image data for later reconstruction, display and transmission. For example, the programming code may execute one or more algorithms capable of performing excitation k-space mapping, RF pulse shape and duration determination, RF pulse scaling, data processing, and so forth, which will be discussed in detail below. An additional interface circuit 58 may be provided for exchanging image data, configuration parameters, and so forth with external system components such as remote access and storage devices 18. Finally, the system control circuit 54 may include various peripheral devices for facilitating operator interface and for producing hard copies of the reconstructed images. In the illustrated embodiment, these peripherals include a printer 60, a monitor 62, and user interface 64 including devices such as a keyboard or a mouse.

Scanner 12 and the control circuit 46 associated therewith provide control signals to produce magnetic fields and radio frequency pulses in a controlled manner to excite and encode specific gyromagnetic material within the subject 26. As noted above, in the present embodiments such specific encoding may include varying the RF pulse shape and duration to obtain variable slice thickness at constant gradient amplitudes. Further, the trajectory that the RF pulse traverses through excitation k-space may be determined for each MR scanner, such that scanner 12 may have a unique RF pulse-excitation k-space relationship. The scanner 12 and control circuit 46 also sense the signals emanating from the selected gyromagnetic material and may store the signals and/or create an image of the material being scanned. It should be noted that the MRI system described is merely intended to be exemplary, and other system types, such as so-called "open" MRI systems may also be used. Similarly, such systems may be rated by the strength of their primary magnet, and any suitably rated system capable of carrying out the slice selection, data acquisition, and signal processing described below may be employed.

Figure 2:
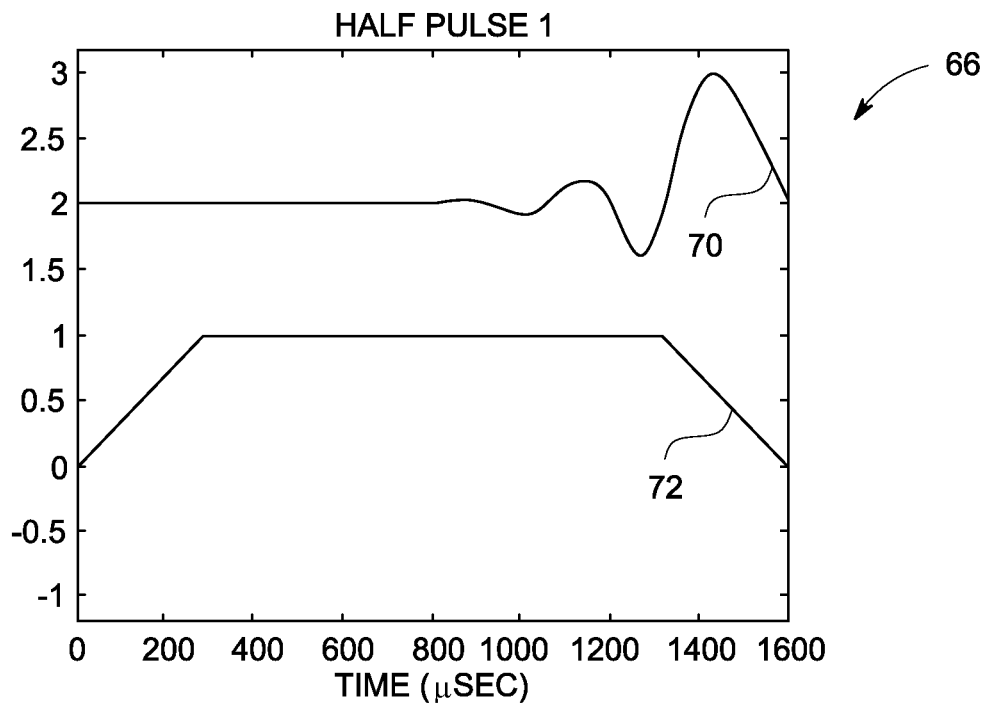
FIG. 2 is a trace of a first and second set of slice select pulses generated by the imaging system of FIG. 1 during a UTE imaging sequence including a first slice select RF half pulse and a second slice select RF half pulse, in accordance with an aspect of the present disclosure.
Figure 2:
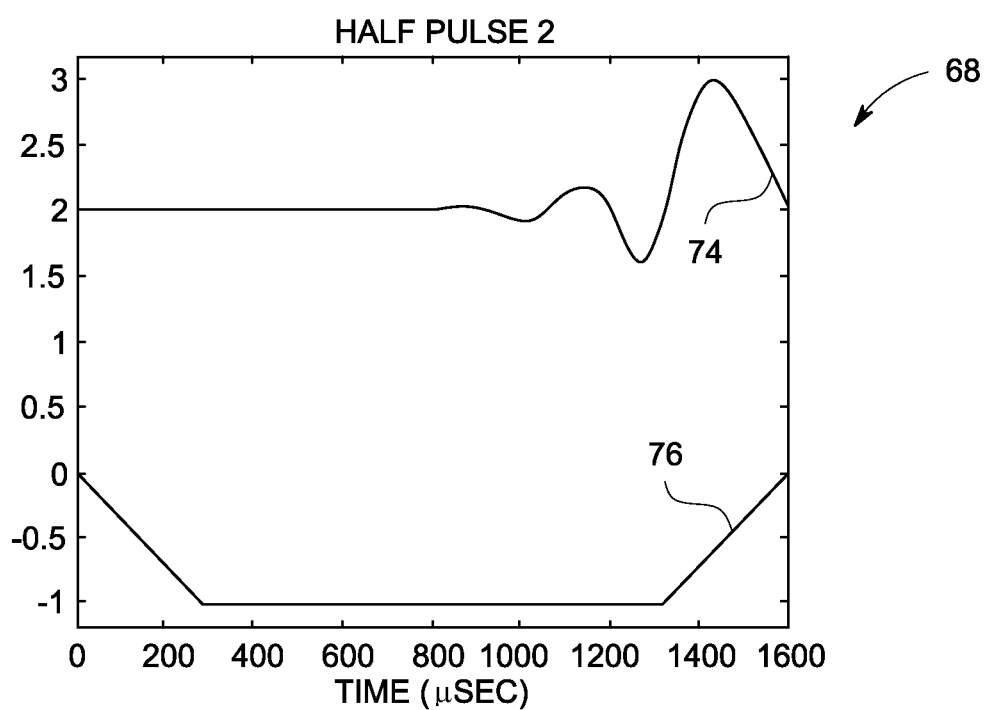

The MR system 10 may be employed to perform specific imaging sequences, such as the UTE imaging sequences mentioned above. As discussed, UTE imaging sequences may utilize slice select RF half pulses to excite the gyromagnetic material that is generally defined by the gradient waveform. Specifically, during a UTE imaging sequence, two sets of data may be acquired resulting from the use of a slice select RF half pulse and two gradient pulses with equal amplitude but differing phase. An example of such pulse combinations is provided in FIG. 2, which includes a first slice select half pulse sequence 66 and a second slice select half pulse sequence 68. The first slice select half pulse sequence 66 includes a first slice select RF half pulse 70 and a first slice select gradient pulse 72. Likewise, the second slice select half pulse sequence 68 includes a second slice select RF half pulse 74 and a second slice select gradient pulse 76. In a typical UTE imaging sequence, the first slice select half pulse sequence 66 would be performed followed by data acquisition. The second slice select half pulse sequence 68 would be performed thereafter, which would be followed by a second data acquisition. As noted above, data acquired after the first slice select half pulse sequence and the data acquired after the second slice select half pulse sequence are then added to produce data representative of a slice of a subject of interest. Further, it should be noted that the first and second slice select RF half pulses 70 and 74 have equal shape and duration, such that the data acquired from their respective selected materials match.

As noted above, the thickness of the slice of the subject of interest may be varied by altering the shape and duration of the RF half pulse, such as the first RF half pulse 70 and the second RF half pulse 74. For example, in the context of the first slice select half pulse sequence 66, the gradient pulse 72 is kept substantially constant, and the first RF half pulse 70 is advanced along the horizontal time axis with respect to the gradient pulse 72. In advancing the first RF half pulse 70 with respect to the first gradient pulse 72, the slice select thickness may be increased. To decrease the slice select thickness, the first RF half pulse 70 may be retracted. It should be noted that the shape and duration of the first RF half pulse 70 may also change as it is advanced or retracted, and that the shape and duration of the first RF half pulse 70 may be determined during runtime (i.e., on-the-fly). Accordingly, during a UTE imaging sequence, the shape and duration (as well as the scaling) of the first and second slice select RF half pulses 70 and 74, which are substantially equivalent, are determined at runtime.

Figure 3:
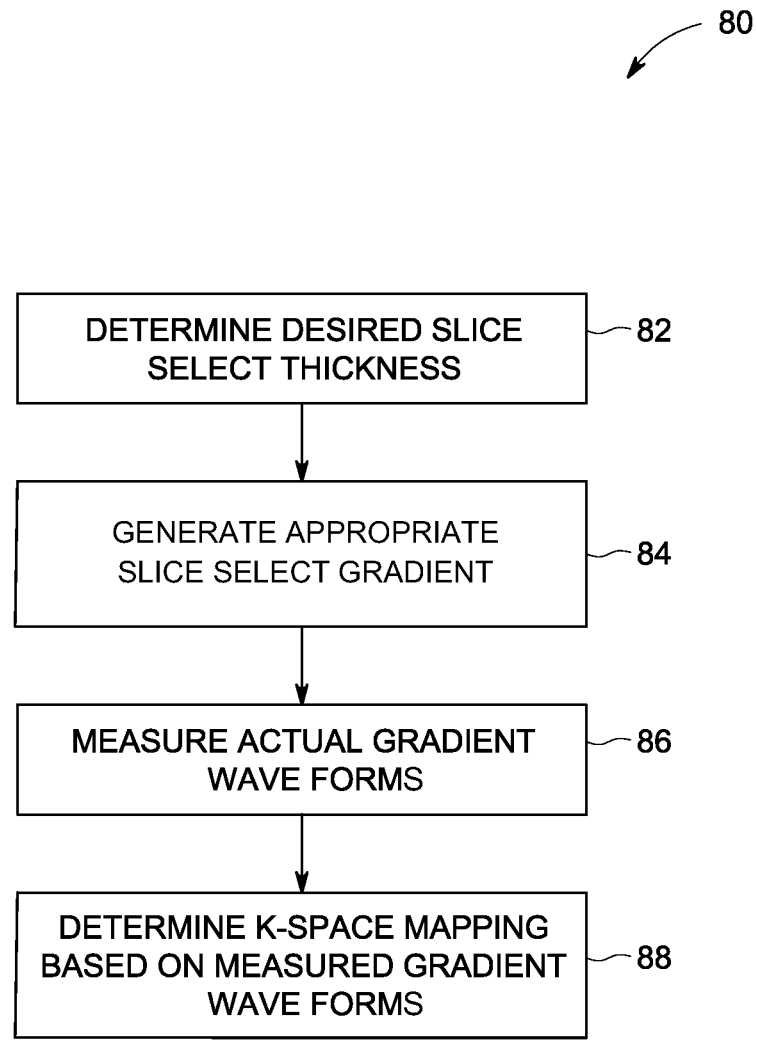
FIG. 3 is a process flow diagram of a method for determining the trajectory of a slice select RF half-pulse through excitation k-space prior to or during a UTE imaging sequence, in accordance with an aspect of the present disclosure.

To determine the shape and duration of the first and second slice select RF half pulses 70, 74, the trajectory of the RF pulses through excitation k-space must first be mapped, as noted above. Further, while the determination of the shape and duration of the slice select RF half pulses 70, 74 may be performed at runtime, the present embodiments advantageously allow a user to calibrate the MR system 10, such that the trajectory may be mapped prior to performing imaging. An embodiment of a method 80 for performing such trajectory mapping is illustrated as a process flow diagram in FIG. 3. It should be noted that the method 80 may be performed on a phantom, or may be performed in any such manner prior to UTE imaging. However, it is also contemplated that the method 80 may be a part of an imaging routine wherein the mapping is performed while a patient is placed in the scanner 12. To begin mapping the trajectory, a slice select thickness is determined (block 82), which may be any desired slice thickness. In one embodiment, the determined slice select thickness may be a minimum slice select thickness that may be used for a given imaging sequence and/or application. Based on the desired slice select thickness, a user and/or processing circuitry of the MR system 10 may design and generate a slice select gradient (block 84). Designing the slice select gradient may include determining an appropriate gradient amplitude and slew rate. For example, in one embodiment the gradient amplitude may be maximized to allow for a variety of slice selection thicknesses while maintaining the amplitude below levels that may be beyond the limits of the MR machine and below levels which may cause discomfort to a patient during imaging. Further, the selected slew rates may be constrained by the capabilities of the imaging system on which the process is performed.

After the slice select gradient has been designed and generated (block 84), the actual waveform of the slice select gradient may be measured (block 86). For example, due to slight imperfections in the equipment used to generate the slice select gradient (e.g., gradient field coils 30, 32, and 34), the actual slice select gradient that is produced may slightly vary from the slice select gradient that was designed. In the present embodiments, a gradient waveform at positive polarity and a gradient waveform of negative polarity may be measured, with the measured gradient waveforms being suitable for use for all desired slice thicknesses in a given plane. For example, a positive and negative polarity gradient waveform may be measured for coronal (frontal) slices, sagittal (lateral) slices, and axial (transverse) slices. The process used to measure the actual slice select gradient waveform may include, as an example, a self encoding process, which has been described by Onodera et al. Journal of Physics E: Scientific Instruments, Vol. 20 pp. 416-419 (1987), the disclosure of which is incorporated herein by reference in its entirety. Based on the measured gradient waveform, the trajectory of the slice select RF half pulse through excitation k-space may then be determined (block 88).

To determine the trajectory of the slice select RF half pulse (block 88), a parameter of the gradient waveform may be measured. In one embodiment of the present approaches, the parameter may include the area under a trace of the gradient waveform, which may be determined by integrating the gradient waveform in reverse time. Further, the integration in reverse time may be performed using the origin of k-space as a reference point. In mapping the trajectory of the RF half pulse through excitation k-space, a relationship may be determined between the RF half pulse and k-space. In the present embodiments, such as during a UTE imaging sequence, this relationship is maintained while varying the extent of excitation k-space traversed by the RF half pulse to vary the slice select thickness, as described below. Examples of the trajectory and relationship between the RF half pulse and k-space are illustrated in FIGS. 5-8, which are described below.

Figure 4:
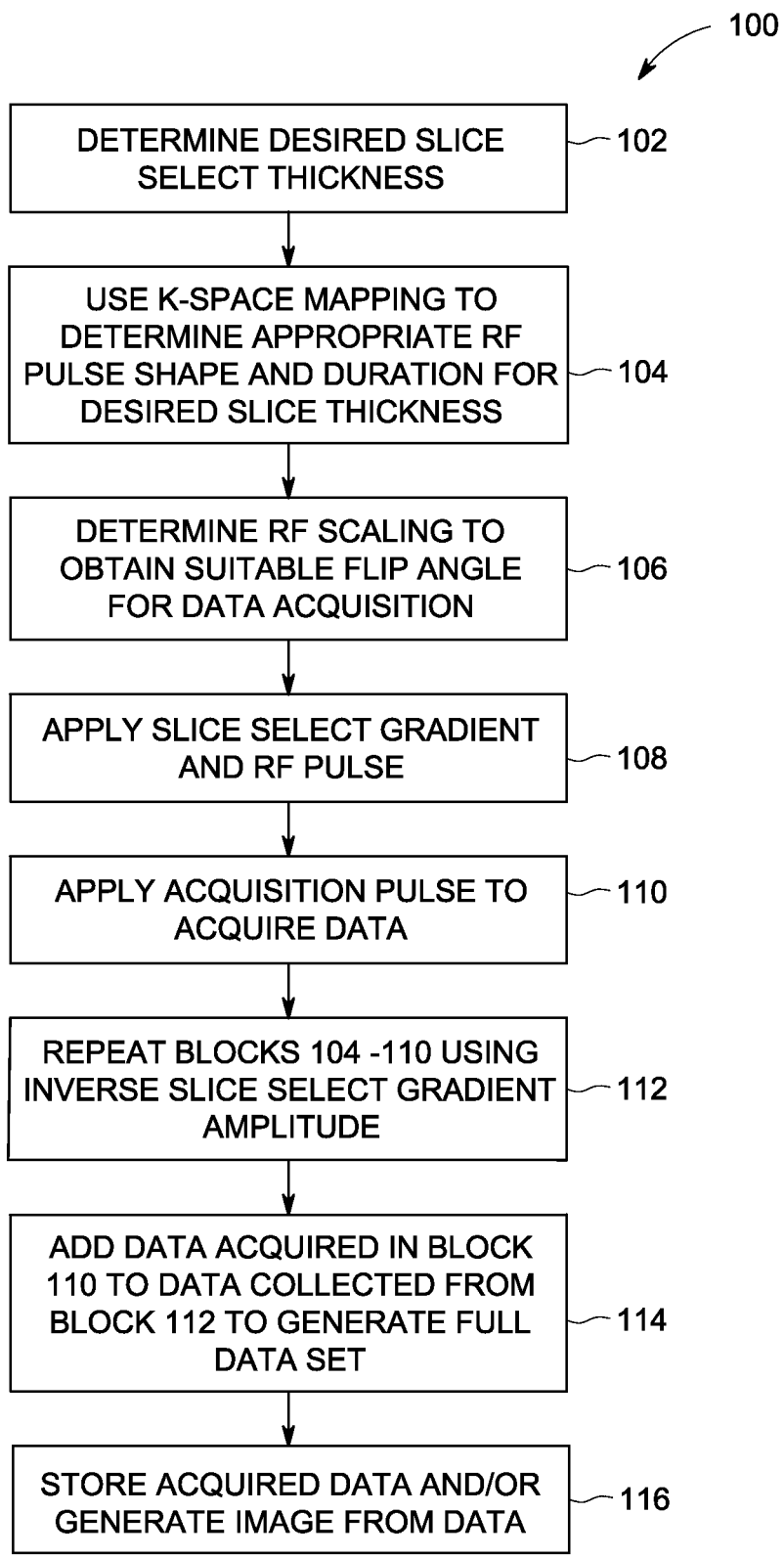
FIG. 4 is a process flow diagram of a method for performing UTE imaging using slice select RF half-pulses generated based on a desired slice select thickness, a constant slice select gradient waveform, and the trajectory determined in FIG. 3, in accordance with an aspect of the present disclosure.

An embodiment of a method 100 for performing a UTE imaging sequence is illustrated as a process flow diagram in FIG. 4. It should be noted that the method 100 may be performed after the method 80, such as immediately following method 80 or a substantial amount of time thereafter. In the method 100, a user and/or the processing circuitry of the MR system 10 may determine a desired slice select thickness for imaging the patient (block 102). The desired slice select thickness may determine the extent to which the RF half pulse may traverse the trajectory obtained from method 80. Based on this extent, the RF pulse shape and duration is determined (block 104). In the present embodiments, the RF pulse shape and duration may be represented by a windowed Sinc function (i.e., a Sinc pulse):

$$Sinc(k(t)) = \frac{\sin(\pi k(t) \Delta z)}{\pi k(t) \Delta z}, \quad (1)$$

where $\Delta z$ is the slice thickness and $k(t)$ is the trajectory of the slice select RF half pulse through excitation k-space. Further, the window function constraining the shape of the RF half pulse may be a Hanning window.

Due to the variation in the shape and duration of the RF half pulse, it should be noted that the RF half pulse may be scaled (block 106) to an appropriate magnitude to allow a suitable amount of RF energy to be deposited into the selected slice for sufficient transverse magnetization generation. The flip angle resulting from the RF half pulse may be proportional to the integral of the RF half pulse waveform. That is, to obtain a desired flip angle of the selected gyromagnetic material, the RF pulse shape and duration may be scaled to provide an amount of RF energy suitable to flip the magnetization of the gyromagnetic material by the desired angle. The scaling may be calculated by the following equation:

$$Sinc(k(t))\gamma = \theta, \quad (2)$$

where $Sinc(k(t))$ represents the shape and duration of the RF half pulse, $\gamma$ represents the magnetic susceptibility of the gyromagnetic material, and $\theta$ is the flip angle in radians. In the present embodiments, the pulse is multiplied by a constant to obtain a desired value of $\theta$.

Once the RF half pulse shape, duration, and scaling have been determined (blocks 104 and 106), the slice select RF half pulse and the slice select gradient are applied (block 108) to select a slice having a desired thickness. Once the slice has been selected, an acquisition pulse or pulse sequence (e.g., a radio readout gradient pulse) may be applied for data acquisition (block 110). This process may be performed iteratively until the desired amount of excitation and/or imaging k-space has been filled (e.g., substantially all of k-space, selected portions of k-space, or undersampled portions of k-space). As mentioned above, in the context of UTE imaging, the use of a first slice select half pulse sequence followed by data acquisition results in the acquisition of a first set of data, which may be approximately half of the total data of the desired slice. To obtain the remainder of the data, blocks 104-110 are re-performed (block 112) using a slice select gradient having a reversed phase compared to the original slice select gradient, such as the gradient pulses illustrated in FIG. 2.

Once the data acquired as a result of the first slice select half pulse sequence and the data acquired as a result of the second slice select half pulse sequence have been obtained, the two sets of data may be stored separately or added to generate a full data set (block 114). The full acquired data set may then be stored and/or used to generate an image (block 116) that is substantially free of artifacts resulting from signal produced by gyromagnetic material outside of the selected slice.

Figure 7:
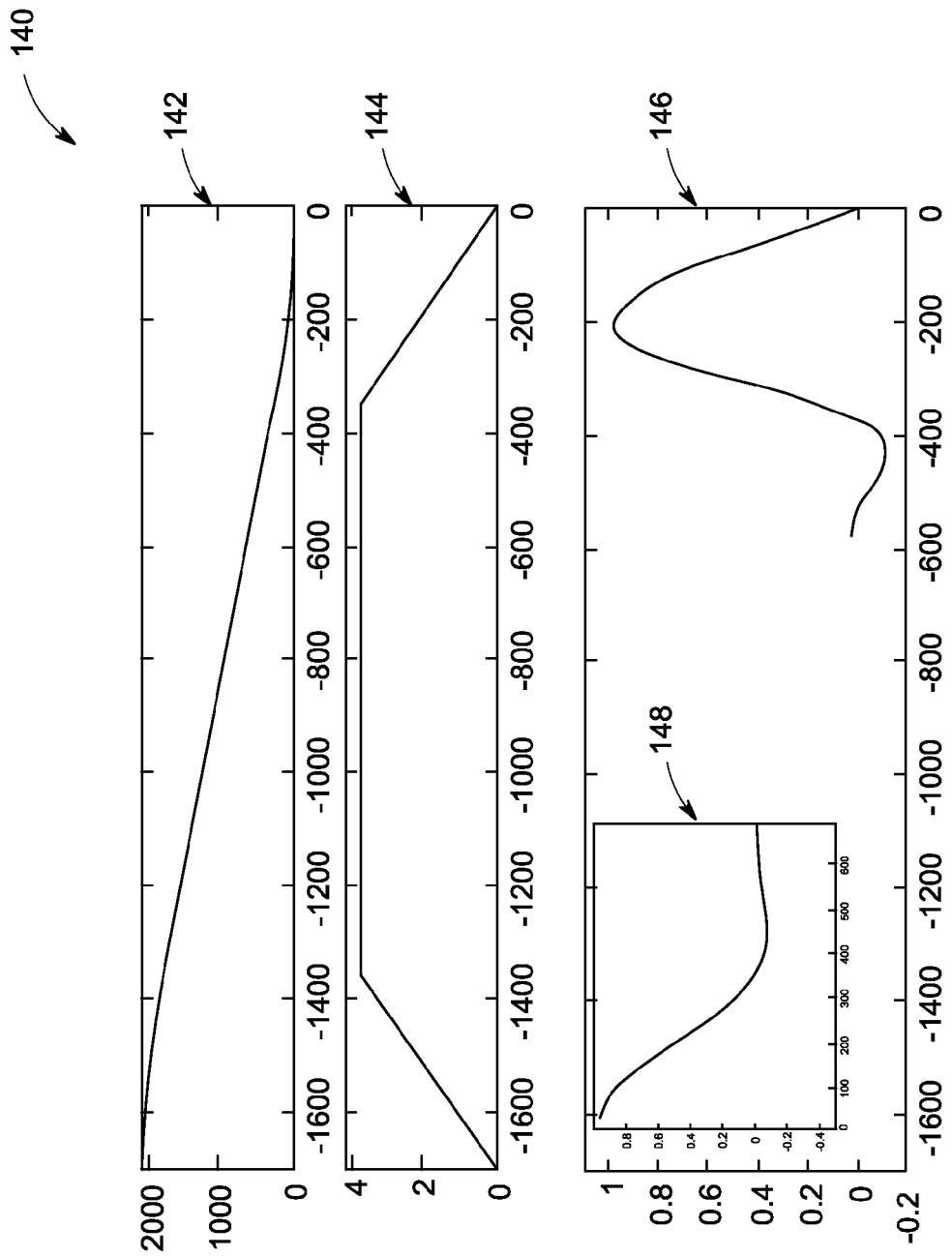
FIG. 7 is a set of excitation k-space data, gradient amplitude data, RF pulse data, and RF trajectory through k-space data determined using the methods set forth in FIGS. 3 and 4 and corresponding to a slice select thickness of 3 mm, in accordance with an aspect of the present disclosure.
Figure 8:
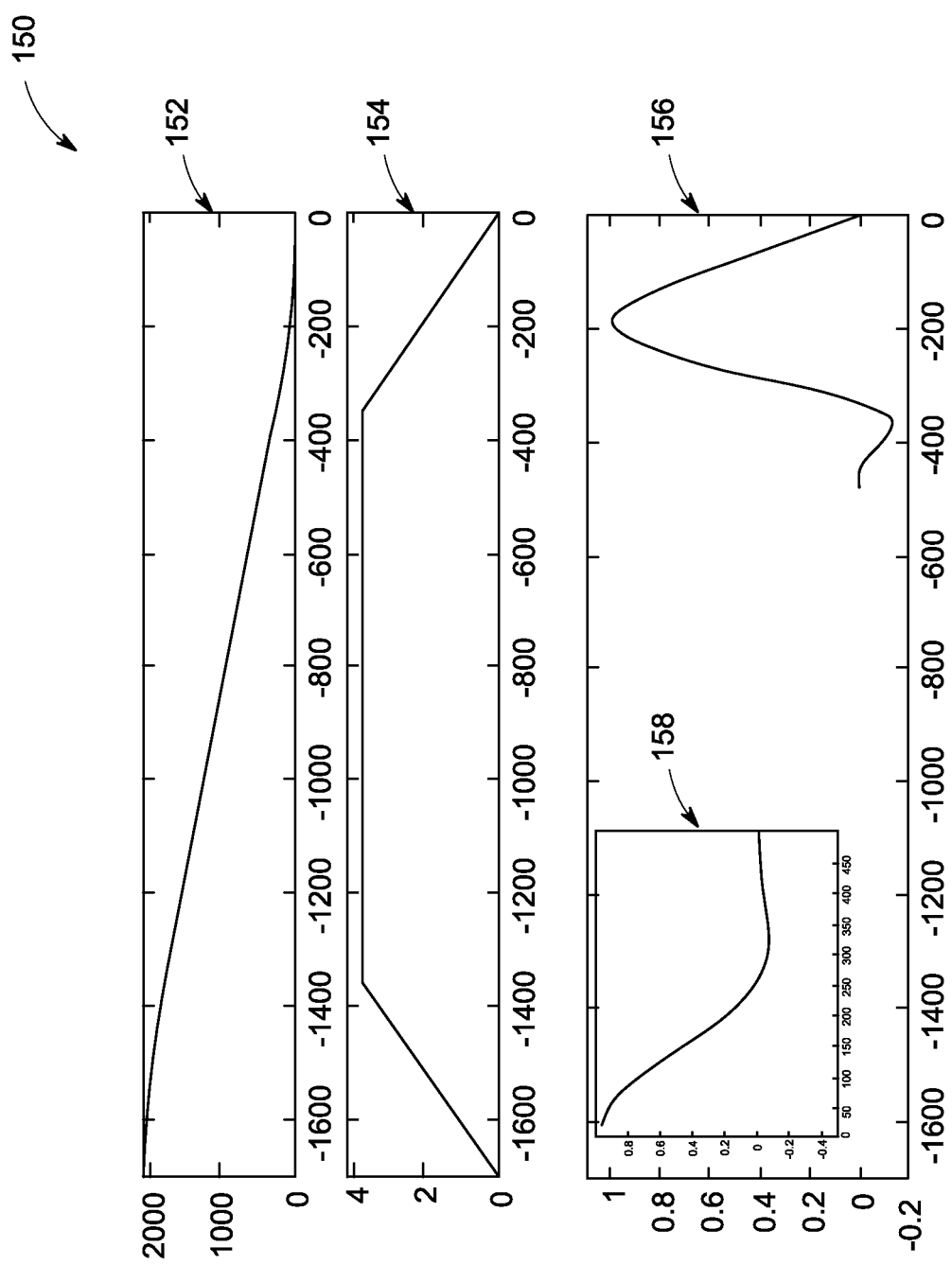
FIG. 8 is a set of excitation k-space data, gradient amplitude data, RF pulse data, and RF trajectory through k-space data determined using the methods set forth in FIGS. 3 and 4 and corresponding to a slice select thickness of 4 mm, in accordance with an aspect of the present disclosure.

As noted above, the runtime calculation of the slice select RF half pulse shape and duration may be performed using a substantially constant gradient waveform and a substantially constant relationship between the RF half pulse and k-space. This calculated RF pulse may be used to select a slice having substantially no signal contamination from out-of-slice materials, with the RF pulse shape and duration varying with varying slice thickness. Such relationships may be appreciated with reference to FIGS. 5-8, which are sets of data corresponding to the RF pulse trajectory though k-space, the gradient waveform, the calculated RF pulse, and the relationship between the RF pulse and k-space. Specifically, FIG. 5 illustrates data for a slice thickness of 1 millimeter (mm), FIG. 6 illustrates data for a slice thickness of 2 mm, FIG. 7 illustrates data for a slice thickness of 3 mm, and FIG. 8 illustrates data for a slice thickness of 4 mm.

As noted above, FIG. 5 illustrates a set of data 120 representative of a first half pulse sequence used to select a slice having a thickness of approximately 1 mm. The set of data 120 includes a trajectory plot 122 that the calculated RF pulse will traverse through excitation k-space as it is applied. As noted above, the trajectory plot 122 is calculated by integrating, in reverse time, a measured gradient waveform 124. As mentioned, the reference point for the reverse time integration may be the origin of imaging k-space. As illustrated, the gradient waveform 124 is a trapezoidal function having maximum amplitude just after the −1400 mark, which may be considered to be slightly less than 1400 microseconds until the end of the slice select pulse sequence.

The maximum amplitude of the gradient waveform 124 is maintained up until just after the −400 mark, at which point the gradient begins to slew down. It is approximately at this point that a calculated RF half pulse 126 has its maximum amplitude, and the amplitude of the RF half pulse 126 and the amplitude of the gradient waveform 124 begin to decrease, as they both decay and eventually end at t=0. As noted above, the calculated RF half pulse 126 advances with increasing slice thickness while maintaining a substantially constant spatial relationship with k-space, represented by plot 128. Further, while this relationship is substantially maintained, the extent to which the calculated RF half pulse traverses the determined trajectory through excitation k-space 122 varies. It should be noted that this variance may result in a scaling up or scaling down of the horizontal axis of plot 128.

Figure 5:
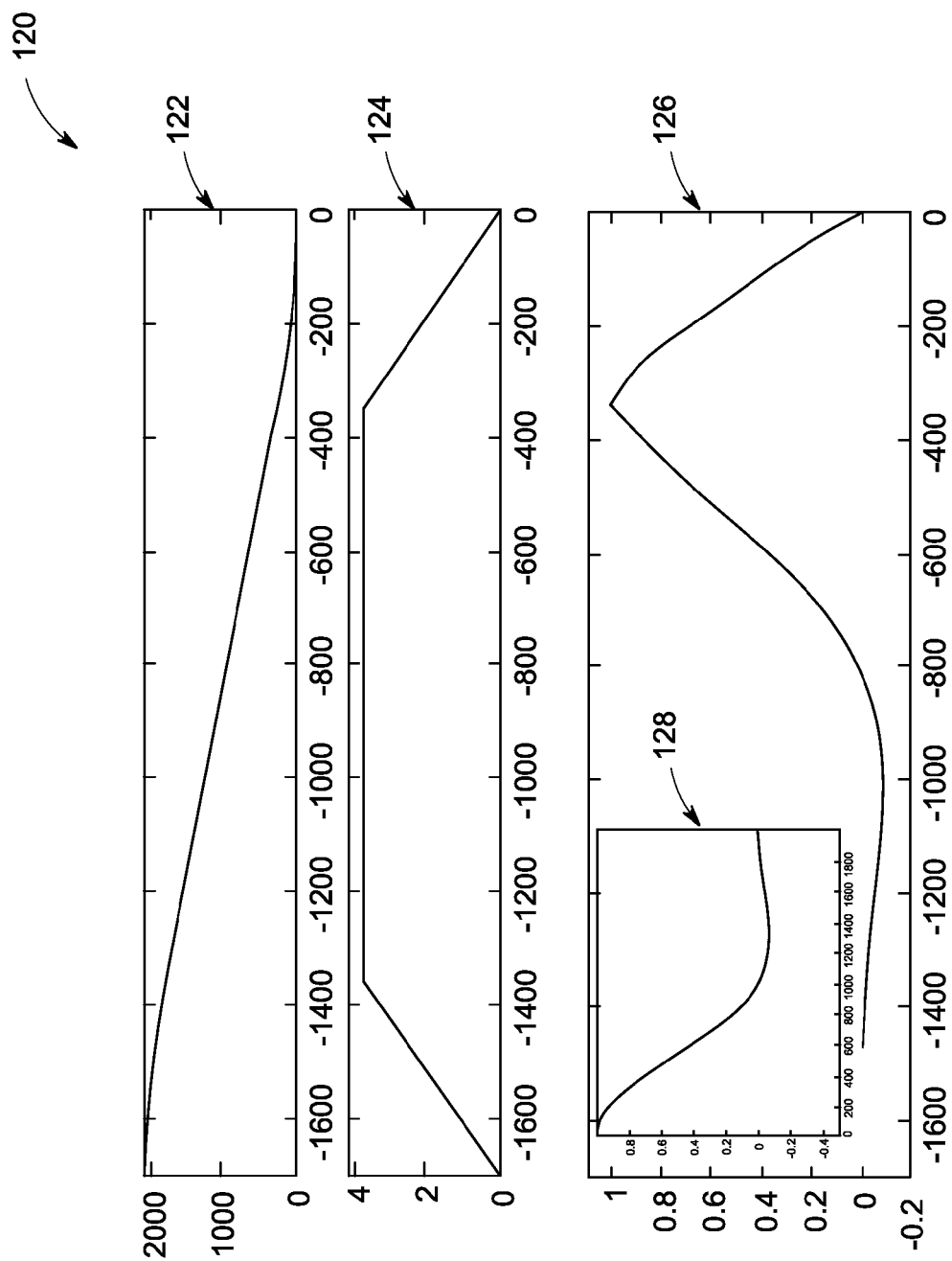
FIG. 5 is a set of excitation k-space data, gradient amplitude data, RF pulse data, and RF trajectory through k-space data determined using the methods set forth in FIGS. 3 and 4 and corresponding to a slice select thickness of 1 millimeter (mm), in accordance with an aspect of the present disclosure.
Figure 6:
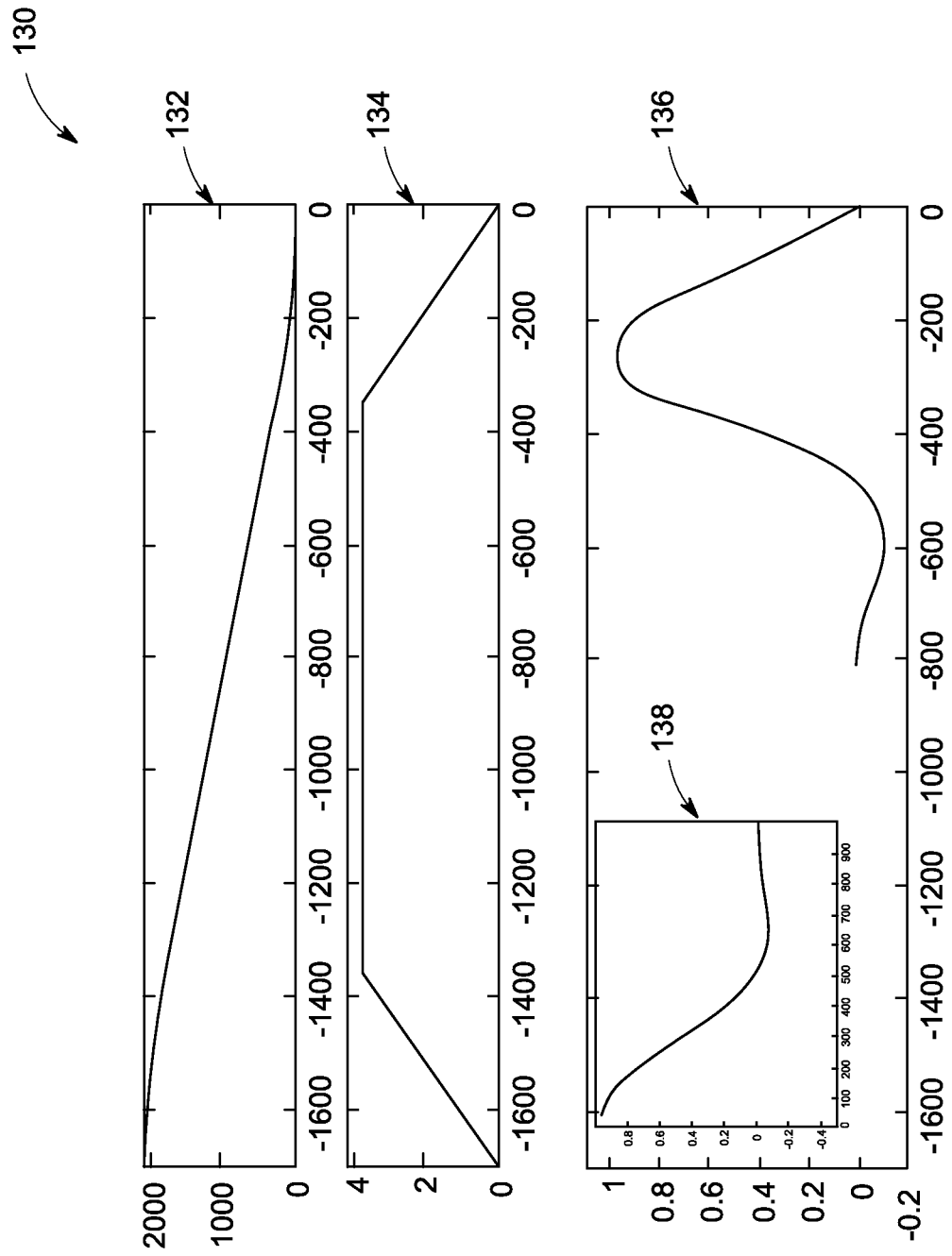
FIG. 6 is a set of excitation k-space data, gradient amplitude data, RF pulse data, and RF trajectory through k-space data determined using the methods set forth in FIGS. 3 and 4 and corresponding to a slice select thickness of 2 mm, in accordance with an aspect of the present disclosure.

FIG. 6 depicts a similar data set 130 to that presented in FIG. 5, and contains data representative of a half pulse sequence corresponding to a slice select thickness of 2 mm. As will be appreciated, a plot of the trajectory through excitation k-space 132 determined for the 2 mm slice thickness is substantially the same as that determined for the 1 mm slice thickness, as a gradient waveform 134 from which the trajectory 132 is calculated is substantially the same as the waveform 124 in FIG. 5. However, as noted above, the maximum amplitude of the RF half pulse is advanced (moved to the right) in the time domain with respect to the gradient waveform 134 to obtain a larger slice select thickness. Accordingly, FIG. 6 illustrates an RF half pulse 136 having an onset and maximum amplitude closer to t=0 compared to the RF half pulse 126 of FIG. 5. Specifically, the RF half pulse 136 begins just before t=−800 and has a maximum amplitude at about t=−250. As mentioned, the spatial relationship between the RF pulse and k-space remains substantially the same, but is scaled depending on the extent to which excitation k-space is traversed. Accordingly, plot 138 represents the spatial relationship as being reduced on the horizontal axis compared to plot 128.

FIG. 7 illustrates similar data 140 for a slice thickness of 3 mm. The data 140 includes an excitation k-space trajectory 142 and gradient waveform 144 equal to the respective trajectories 122 and 132 and gradient waveforms 124 and 134 in FIGS. 5 and 6. However, as the slice thickness has been increased, the data 140 includes a calculated RF half pulse 146 having an onset and maximum amplitude that are advanced along the time axis compared to the RF half pulses 126 and 136 of FIGS. 5 and 6, respectively. Specifically, the RF half pulse 146 has an onset at about t=−600 and a maximum amplitude at just before t=−200. Accordingly, a plot 148 of the relationship between the RF pulse and k-space is reduced compared to the plots 128 and 138, as RF energy is deposited into a smaller portion of excitation k-space.

Data 150 representative of a half pulse sequence used to obtain a slice thickness of 4 mm is illustrated in FIG. 8. Again, the data contains an excitation k-space trajectory 152 and gradient waveform 154 that are the same as those of FIGS. 5-7. As noted above, as the desired slice select thickness increases, the RF half pulse is advanced along the time axis with respect to the gradient waveform. Thus, the data 150 includes an RF half pulse 156 having an onset that is advanced along the time axis compared to the RF half pulses set forth in FIGS. 5-7. Specifically, the RF half pulse 156 has an onset between about t=−600 and t=−400, and a maximum amplitude occurring at about t=−200. As in FIGS. 6 and 7, a plot 158 of the spatial relationship between the RF pulse and k-space maintains is shape, but the k-space axis is reduced compared to FIGS. 5-7, indicating a deposition of the RF energy in a smaller portion of excitation k-space. Again, changing the shape and duration of the RF pulse in such a manner allows variable slice select thicknesses while substantially eliminating out-of-slice signal contamination.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A method of performing a magnetic resonance imaging sequence, on an imaging system via magnetic resonance system control circuitry, comprising:

in a 2-dimensional ultra-short echo time pulse sequence, determining a desired slice select thickness;

determining a radiofrequency slice select pulse shape and duration based upon the desired slice select thickness while maintaining a desired relationship between excitation k space and radiofrequency amplitude;

determining a radiofrequency scaling of the radiofrequency slice select pulse based on the determined radiofrequency pulse shape and duration in order to obtain data from gyromagnetic material within the desired slice select thickness; and subsequently performing a magnetic resonance frequency imaging process based upon the radiofrequency scaling, with the magnetic resonance imaging process comprising performing one or more 2-dimensional ultra-short echo time magnetic resonance slice select pulse sequences in which the radiofrequency slice select pulse itself determines slice select thickness.

2. The method of claim 1, wherein the desired relationship between excitation k space and radiofrequency amplitude is determined by a measured gradient amplitude of the imaging system on which the imaging sequence is performed.

3. The method of claim 1, comprising measuring a parameter of a slice select gradient waveform based on the desired slice select thickness, wherein the radiofrequency pulse shape and duration are based upon the measured parameter.

4. The method of claim 3, wherein the measured parameter is the area under a trace of the slice select gradient magnitude versus time.

5. The method of claim 4, wherein the area is measured by integration in reverse time.

6. The method of claim 5, wherein a reference point beginning integration in reverse time corresponds to an origin of imaging k-space.

7. The method of claim 1, wherein the image acquisition pulse sequence is performed utilizing the maximum available slice select gradient amplitude suitable for patient imaging with respect to the imaging system on which the image acquisition pulse sequence is performed.

8. A method of performing magnetic resonance imaging, via magnetic resonance system control circuitry, comprising:
determining a radiofrequency (RF) slice select half-pulse shape and duration via a process, comprising:
determining a desired slice select thickness;
in a 2-dimensional ultra-short echo time pulse sequence, applying a slice select gradient waveform that itself obtains the desired slice select thickness;
measuring a parameter of the slice select gradient waveform based on the desired slice select thickness in order to determine a trajectory of a slice select RF half- pulse through excitation k-space; and
generating the RF slice select half-pulse shape and duration based upon the determined trajectory such that the RF slice select half-pulse traverses excitation k-space along the determined trajectory by an amount corresponding to the desired slice select thickness; and
performing a 2-dimensional ultra-short echo time magnetic resonance frequency imaging process, with a magnetic resonance imaging system, in which a plurality of slice select pulse sequences are performed, wherein slice select thickness itself is varied between the plurality of slice select pulse sequences by varying an extent of excitation k-space traversed by the RF slice select half-pulse while using substantially the same slice select gradient waveform amplitude in each slice select pulse sequence of the plurality of slice select pulse sequences.

9. The method of claim 8, comprising determining radiofrequency scaling based on the determined radiofrequency RF half-pulse shape and duration in order to excite gyromagnetic material within the desired slice select thickness by a predetermined amount.

10. The method of claim 8, wherein the measured parameter is the area under a trace of the slice select gradient magnitude versus time.

11. The method of claim 10, wherein the area is measured by integration in reverse time.

12. The method of claim 11, wherein the integration in reverse time is performed using the origin of k-space as a reference point.

13. The method of claim 10, wherein the plurality of slice select pulse sequences are performed utilizing the maximum available slice select gradient amplitude for an imaging system on which the imaging process image acquisition pulse sequence is performed.

14. A magnetic resonance imaging system comprising:
a primary field magnet;
a set of gradient field coils;
a radiofrequency field coil;
control circuitry coupled to the gradient field coils and to the radiofrequency field coil, the control circuitry configured to apply control signals to the gradient and radiofrequency coils to perform a 2-dimensional ultra-short echo time pulse sequence comprising:
applying a first gradient waveform and a radiofrequency pulse in order to select a set of gyromagnetic material within a slice of a subject of interest, wherein a shape and a duration of the radiofrequency pulse itself determines a particular thickness of the slice;
applying a pulse in order to acquire magnetic resonance data from the set of gyromagnetic material; and
processing circuitry coupled to the control circuitry and configured to determine the shape and the duration of the radiofrequency pulse, applied in the 2-dimensional ultra-short echo time pulse sequence based upon a determined parameter of a second gradient waveform that is suitable in obtaining the particular thickness of the slice, in a reference 2-dimensional ultra-short echo time pulse sequence wherein the shape and the duration of the radiofrequency pulse are such that the particular thickness of the slice is obtained at a plurality of different gradient amplitudes.

15. The system of claim 14, wherein the processing circuitry determines the shape and the duration of the radiofrequency pulse while maintaining a desired relationship between an excitation in k-space and an amplitude of the radiofrequency pulse.

16. The system of claim 14, wherein the processing circuitry determines the parameter of the second gradient waveform by measuring the area under a trace of the second gradient waveform by integrating the trace in reverse time.

17. The system of claim 14, wherein the acquired magnetic resonance data is substantially free of signal contamination from gyromagnetic material outside of the slice of the subject of interest.

18. The system of claim 14, wherein the shape and the duration of the radiofrequency pulse is scaled such that the integral of a trace of the radiofrequency pulse corresponds to a desired flip angle of the gyromagnetic material within the slice.

* * * * *